(12) United States Patent
Tang et al.

(10) Patent No.: US 6,263,956 B1
(45) Date of Patent: Jul. 24, 2001

(54) HEAT DISSIPATING STRUCTURE AND ITS MANUFACTURING METHOD

(75) Inventors: Ping-Huey Tang, Taipei Hsien; Chi-Wei Tien, Taichung Hsien; Hsin-Pu Chen, Taichung, all of (TW)

(73) Assignee: Hsin-Mao Hsieh, Kaohsiung (TW)

( * ) Notice: Subject to any disclaimer, the term of this patent is extended or adjusted under 35 U.S.C. 154(b) by 0 days.

(21) Appl. No.: 09/551,195

(22) Filed: Apr. 17, 2000

(51) Int. Cl.[7] ................................................ H05K 7/20
(52) U.S. Cl. ................................. 165/80.3; 29/890.03
(58) Field of Search ...................... 29/890.03; 165/80.3, 165/185

(56) References Cited

U.S. PATENT DOCUMENTS

| | | | |
|---|---|---|---|
| 5,533,257 | * 7/1996 | Romero et al. | 29/890.03 |
| 5,542,176 | * 8/1996 | Serizawa et al. | 29/890.03 |
| 5,771,966 | * 6/1998 | Jacoby | 165/185 |
| 5,819,407 | * 10/1998 | Terada | 29/890.03 |
| 5,903,977 | * 5/1999 | Fisher et al. | 29/890.03 |
| 6,098,279 | * 11/1998 | Lee | 29/832 |

\* cited by examiner

*Primary Examiner*—Allen Flanigan
(74) *Attorney, Agent, or Firm*—Rosenberg, Klein & Lee

(57) ABSTRACT

The heat dissipating structure mainly includes a heat dissipating base, one or several heat dissipating fins, and a fixing frame. It can improve the ratio of fin's height to width, to increase the effective heat transfer area, and to promote the cooling capacity, especially for electronic elements. About the manufacturing method, it includes three steps: machining, inserting and injecting. So, the manufacturing method is simple and the required machines are general.

6 Claims, 5 Drawing Sheets

HEAT DISSIPATING STRUCTURE AND ITS MANUFACTURING METHOD

BACKGROUND OF THE INVENTION

1. Field of the Invention

The present invention relates to a heat dissipating structure and its manufacturing method. In accordance with the present invention, the heat transfer capacity of the heat dissipating structure is increased.

2. Description of the Prior Art

Referring to FIG. 1, there is shown a conventional heat dissipating structure made of extruded aluminum. It includes a heat dissipating base 11 and a plurality of heat dissipating fins 12 extending upwardly therefrom. The heat dissipating base 11 and these heat dissipating fins 12 are integrally formed. However, because of limitations inherent to the extruded aluminum mold, the ratio of the fin's height to width cannot be too large. Each fin cannot be very thin; and, the fins' distribution is quite limited. Therefore, some designs of fins cannot be realized. Given the development of electronic elements with high working rates, a new technology is needed to overcome the disadvantages of the conventional heat dissipating fins made of extruded aluminum.

SUMMARY OF THE INVENTION

The primary object of the present invention is to provide a heat dissipating structure having increased heat transfer capacity. Particularly, an object is to improve the ratio of the fin's height to width, so as to increase the effective heat transfer area, and enhance the cooling capacity.

The other object of the present invention is to provide a manufacturing method for the heat dissipating structure that is simple and may be carried out without special machines.

DETAILED DESCRIPTION OF THE PREFERRED EMBODIMENTS

Figure 1:
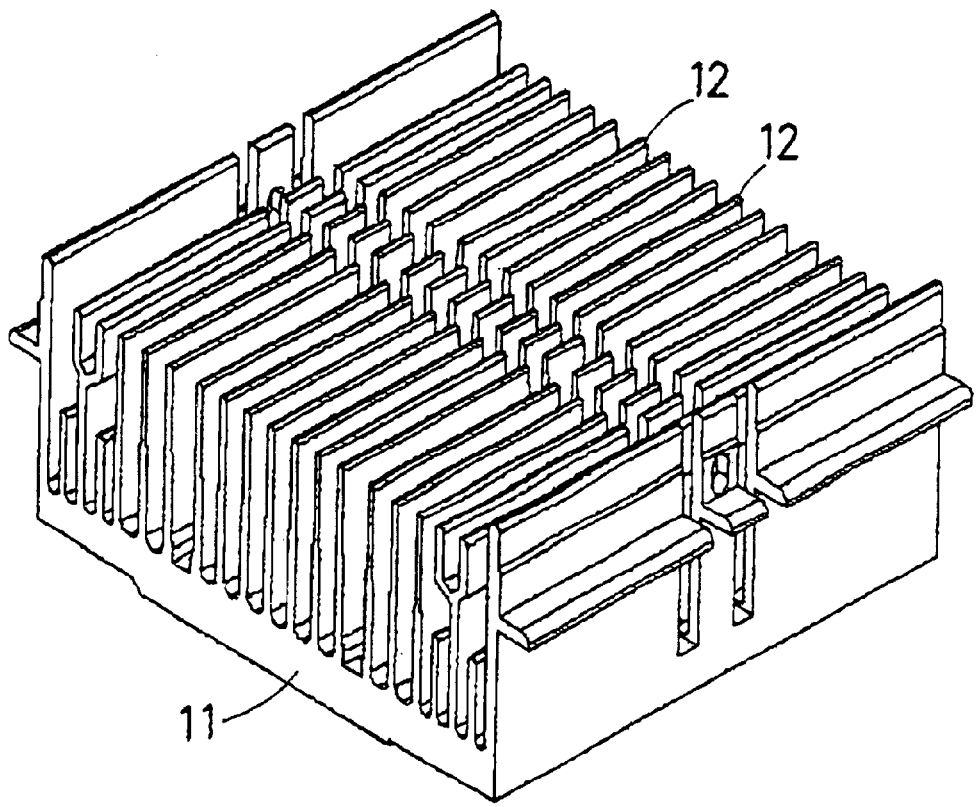
FIG. 1 is a conventional structure having heat dissipating fins made of extruded aluminum.
Figure 2A:
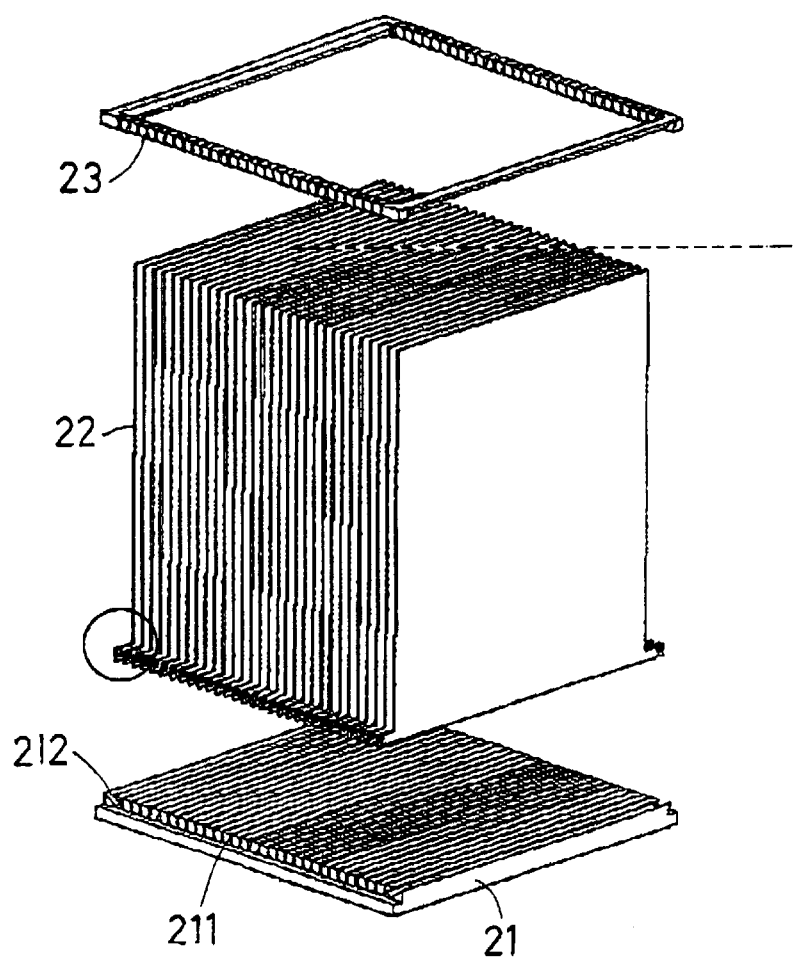
FIGS. 2A and 2B respectively show a perspective view of the present invention and an enlarged view of a selected portion thereof.
Figure 2B:
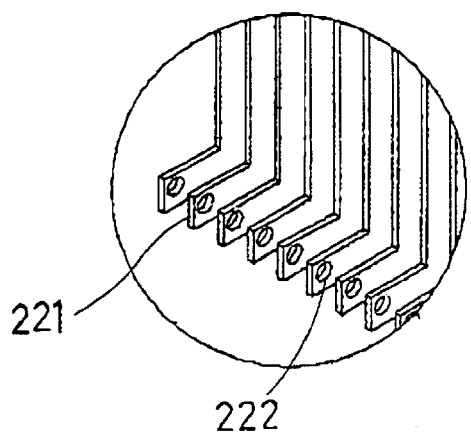
Figure 3A:
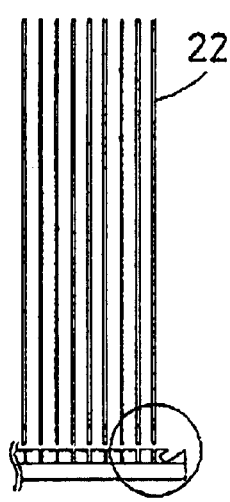
FIGS. 3A and 3B respectively show a side view of the heat dissipating fins and an enlarged view of a selected portion thereof.
Figure 3B:
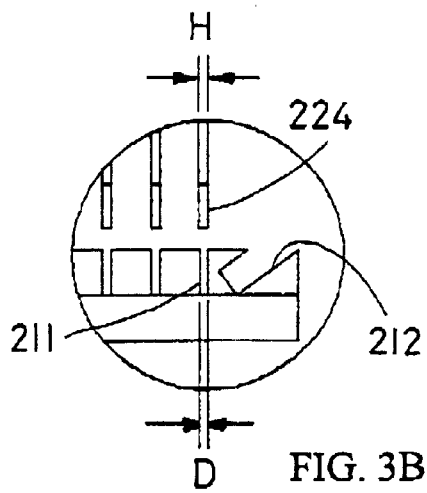
Figure 4A:
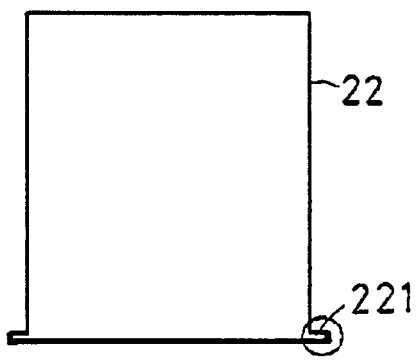
FIGS. 4A and 4B respectively show a front view of a heat dissipating fin and an enlarged view of a selected portion thereof.
Figure 4B:
Figure 5A:
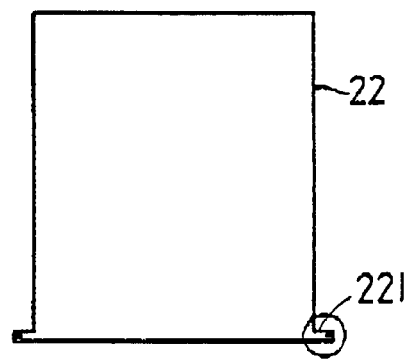
FIGS. 5A and 5B respectively show a front view of another type of a heat dissipating fin and an enlarged view of a selected portion thereof.
Figure 5B:
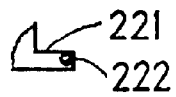
Figure 6A:
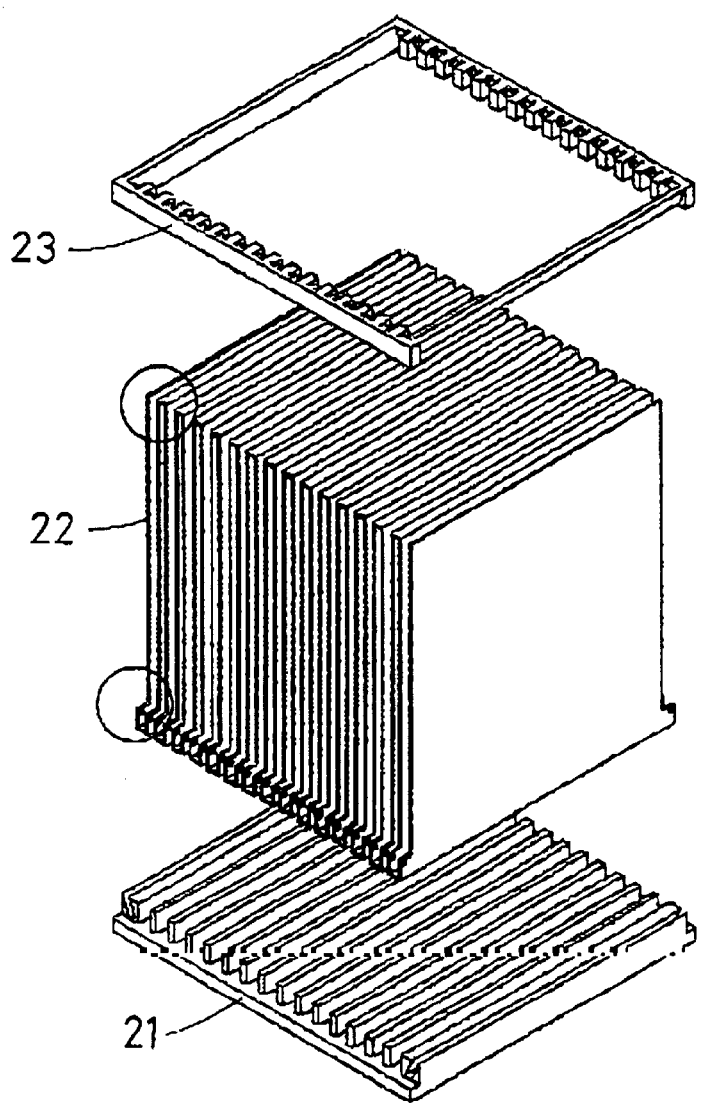
FIGS. 6A, 6B, and 6C respectively show a perspective view of a second preferred embodiment and two enlarged views of two selected portions thereof.
Figure 6B:
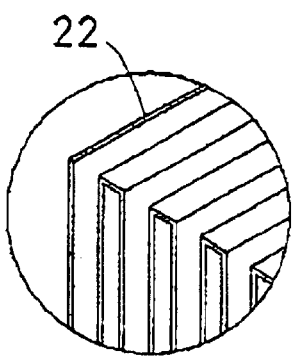
Figure 6C:
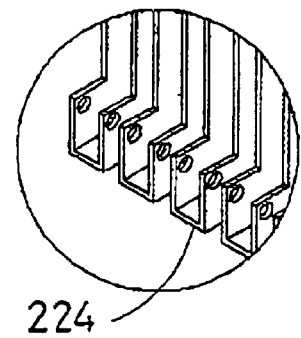
Figure 7A:
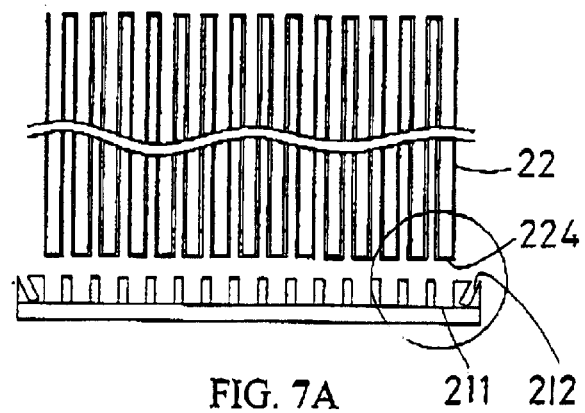
FIGS. 7A and 7B respectively show a side view of the second preferred embodiment and an enlarged view of a selected portion thereof; and, FIG. 8 is a flow chart showing steps of a manufacturing procedure in accordance with the present invention.
Figure 7B:
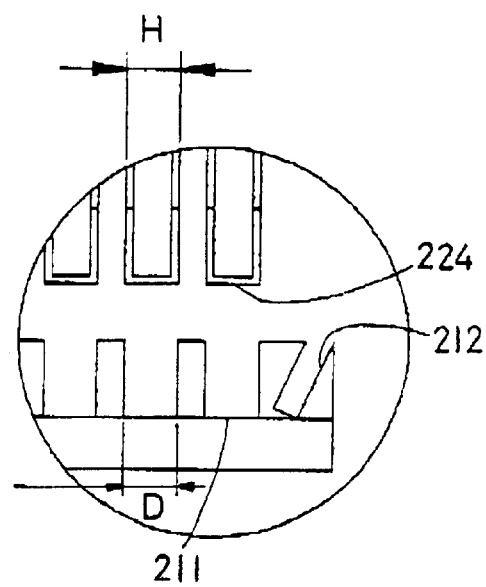

Referring to FIGS. 2A, 2B, 3A, and 3B, there is shown a first preferred embodiment of the present invention. The heat dissipating structure generally comprises a heat dissipating base 21, a plurality of heat dissipating fins 22, and a fixing frame 23.

The heat dissipating base 21 and the heat dissipating fins 22 are not integrally formed. The heat dissipating base 21 has an upper surface. The upper surface has several substantially parallel slots 211. Each slot 211 has a width D slightly less than a thickness H of an inserting portion 224 of the heat dissipating fin 22, so that it will allow a heat dissipating fin 22 to tightly insert therein. This then increases the heat transfer capacity of the heat dissipating structure—that is, to improve the ratio of the fin's height to width, to increase the effective heat transfer area, and to enhance the structure's cooling capacity.

The heat dissipating fins 22 are plural plate-like structures, and the bottom portions of these heat dissipating fins 22 are defined as the inserting portions 224.

To accommodate the fixing frame 23, fixing recesses 212 are disposed near peripheral edges of the upper surface of the heat dissipating base 21. The fixing frame 23 is used for securing said heat dissipating fins 22 on the heat dissipating base 21. The fixing frame 23 is formed by initially introducing a melt fixing material inside the fixing recesses 212 and thereafter cooling. As the material forms as a solid, it forms the fixing frame 23 that secures the heat dissipating fins 22 on the heat dissipating base 21.

Furthermore, as shown in FIGS. 4A, 4B, 5A, and 5B, two protruded flanges 221 are respectively disposed on opposing sides of each heat dissipating fin 22. Each protruded portion 221 is formed with a fixing hole 222 or a notch 223 for enhancing the contacting area and reinforcing the coupling between the heat dissipating base 21 and the heat dissipating fins 22. That is, the melt fixing material can flow through these fixing holes 222 or notches 223. When the melt fixing material is cooled and formed as a solid, it becomes the solid fixing frame 23 which can firmly secure the heat dissipating fins 22 to the heat dissipating base 21. This prevents loose fins from causing poor heat transfer capacity.

Because the thickness of the heat dissipating base 21 cannot be overly thick, the depth of the slots 211 cannot be overly deep. If the height of the heat dissipating fin 22 is too great, the inserted heat dissipating fins 22 will become loose due to vibration or some external force. Thus, the resulting contact between parts may become poor. Consequently, a reduction in heat transfer capacity may result.

The fixing frame 23 is useful in overcoming this problem. The melt fixing material will cover the protruded portions 221 of the heat dissipating fins 22. Once it cools and solidifies to form the fixing frame 23, the coupling of the fins 22 to the base 21 is reinforced. This improves the ratio of the fin's height to width, so as to increase the effective heat transfer area, and to enhance the cooling capacity.

Figure 8:
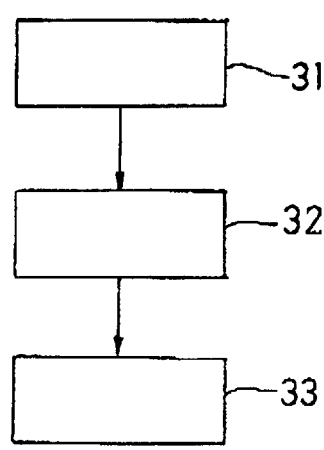

Referring to FIGS. 6A, 6B, 6C, 7A, and 7B, a second preferred embodiment of the present invention is shown. In this example, the heat dissipating fins 22 form a single wave-like plate structure and their bottom portions define inserting portions 224. These inserting portions 224 firmly insert into the corresponding slots 211 of the heat dissipating base 21. Because other elements are effectively the same as those shown in the first preferred embodiment, further description of those elements is omitted. As shown in FIG. 8, the manufacturing method for the present invention comprises the following steps:

(1) Machining 31: A plurality of slots 211 are cut on an upper surface of the heat dissipating base 21; a fixing recess 212 is cut near a peripheral edge of the upper surface of the heat dissipating base 21; and, the heat dissipating fin and formed, then tightly inserted into the corresponding slots 211.

(2) Inserting 32: The heat dissipating fin(s) 22 are forced into tight insert within the corresponding slots 211 of the heat dissipating base 21.

(3) Injecting 33: A melt fixing material is injected inside the fixing recesses 212 and then cooled until it forms a solid. This results in the fixing frame 23 that secures said heat dissipating fin(s) 22 on said heat dissipating base 21.

Practically, if the fixing material is a plastic material, the above steps can be simplified and completed by these three kinds of machines: a computer/numerical controlled machine (like CNC machine), a pressing machine, and a plastic injection machine with corresponding molds. In order to increase the overall heat transfer capacity, the fixing material may be a heat-conductible plastic, or any other metal or non-metal material with higher heat conductibility. Also, the heat dissipating base 21 and heat dissipating fins 22 may be made of copper (Cu), aluminum (Al), copper alloy, aluminum alloy, or the like.

The following Table, Table 1, shows the testing results after testing three samples on a computer's central processing unit (CPU). The area of the CPU for test purposes was $10*12$ mm$^2$, and the actual energy consumption of the CPU was 18.24 W. The fan's size was $50*50$ mm$^2$. The fan's flowing rate was 12 cfm, and its static pressure was 3.8 mmH$^2$O. The temperature of the environment was 45° C. The heat resistance value is defined as the heat resistance between the internal temperature of the CPU and the point above the CPU 30 mm in the air.

| Type Specification | Conventional structure made by Extruded Aluminum | The present invention made by copper (Cu) | The present invention made by aluminum (Al) |
| --- | --- | --- | --- |
| Base dimensions (mm) | L61*W51*H5 | L50*W52*H5 | L50*W52*50 |
| Fin dimensions (mm) | L51*WO.86*H25 | L44*W1*H50 | L44*WO.3*H50 |
| Fin number | 19 | 21 | 30 |
| Fin interval (mm) | 2.45 | 1.25 | 1.276 |
| Ration of fin's height to width | 29 | 50 | 166.67 |
| Total area of fins (mm) | 46943 | 95424 | 113296 |
| Fan position | blowing upward | side blowing | side blowing |
| CPU's max. temperature (° C.) | 87.84 | 76.28 | 72.54 |
| Analytical Heat Resistance (° C./W) | 1.26 | 0.92 | 0.81 |
| Experimental Heat Resistance (° C./W) | 1.28 | 1.01 | 0.90 |

From the results shown in Table 1, it is clearly apparent that the performance of the present invention is better than that of a conventional extruded aluminum structure.

Thus, an improvement in the ratio of the fin's height to width is realized. An increase in the effective heat transfer area, and an enhancement in the cooling capacity for electronic elements are also realized.

What is claimed is:

1. A heat dissipating structure comprising:
   (a) a heat dissipating base having an upper surface, said upper surface having formed therein a plurality of substantially parallel slots, said upper surface defining a peripheral edge having a fixing recess formed therein;
   (b) a plurality of plate-like heat dissipating fin sections each engaging in force fit manner a corresponding one of said slots of said base, each said heat dissipating fin section including a bottom inserting portion having a thickness dimension sufficiently greater than a width dimension of said slot corresponding thereto to enable said force fit engagement; and,
   (c) a fixing frame for securing said heat dissipating fin sections to said heat dissipating base, said fixing frame being solidified from a melt fixing material to conform to said fixing recess of said heat dissipating base;
   whereby said heat dissipating structure is augmented in heat transfer capacity.

2. The heat dissipating structure as recited in claim 1 wherein each said heat dissipating fin section includes a pair of protruded flange portions extending from opposing ends of said inserting portion thereof, each said protruded flange portion having formed therein at least one fixing opening; whereby said the contact area and strength of engagement between each said heat dissipating fin section and said heat dissipating base are augmented.

3. A heat dissipating structure comprising:
   (a) a heat dissipating base having an upper surface, said upper surface having formed therein a plurality of substantially parallel slots;
   (b) a continuous plate structure having a substantially corrugated configuration defining a plurality of heat dissipating fin sections each engaging in force fit manner a corresponding one of said slots of said base, each said heat dissipating fin section including a bottom inserting portion having a thickness dimension sufficiently greater than a width dimension of said slot corresponding thereto to enable said force fit engagement; and,
   (c) a fixing frame for securing said heat dissipating fin sections to said heat dissipating base, said fixing frame being solidified from a melt fixing material to conform to said fixing recess of said heat dissipating base;
   whereby said heat dissipating structure is augmented in heat transfer capacity.

4. The heat dissipating structure as recited in claim 3 wherein each said heat dissipating fin section includes a pair of protruded flange portions extending from opposing ends of said inserting portion thereof, each said protruded flange portion having formed therein at least one fixing opening; whereby said the contact area and strength of engagement between each said heat dissipating fin section and said heat dissipating base are augmented.

5. A method of manufacturing a heat dissipating structure comprising the steps of:
   (a) establishing a heat dissipating base having an upper surface, said upper surface defining a peripheral edge;
   (b) machining to cut into said upper surface of said heat dissipating base a plurality of slots;
   (c) machining to cut a fixing recess adjacent said peripheral edge of said heat dissipating base;
   (d) press forming at least one heat dissipating fin section configured to engage a corresponding one of said slots of said heat dissipating base in force fit manner;
   (e) inserting a portion of said heat dissipating fin section into said slot corresponding thereto in force fit manner;
   (f) injecting a melt fix material into said fixing recess of said heat dissipating base; and,
   (g) solidifying said melt fix material to form a fixing frame conformed to said fixing recess for securing said heat dissipating fin section to said heat dissipating base.

6. The method of manufacturing a heat dissipating structure as recited in claim 5 wherein a plurality of heat dissipating fin sections are press formed, portions of each heat dissipating fin section being inserted in force fit manner into one said slot corresponding thereto.

* * * * *